United States Patent [19]

Kabacoff et al.

[11] Patent Number: 5,176,788
[45] Date of Patent: Jan. 5, 1993

[54] METHOD OF JOINING DIAMOND STRUCTURES

[75] Inventors: Lawrence T. Kabacoff, Columbia; John Barkyoumb, Beltsville, both of Md.

[73] Assignee: The United States of America as represented by the Secretary of the Navy, Washington, D.C.

[21] Appl. No.: 726,483

[22] Filed: Jul. 8, 1991

[51] Int. Cl.$^5$ .............................................. C30B 29/00
[52] U.S. Cl. ........................ 156/603; 156/DIG. 68; 156/DIG. 73; 156/DIG. 80; 156/DIG. 105; 423/446
[58] Field of Search ........ 156/603, DIG. 68, DIG. 73, 156/DIG. 80, DIG. 105; 423/446; 437/11

[56] References Cited

U.S. PATENT DOCUMENTS

| | | | |
|---|---|---|---|
| 3,031,269 | 4/1962 | Bovenkerk | 156/DIG. 68 |
| 4,104,441 | 8/1978 | Fedoseev et al. | 156/613 |
| 4,151,008 | 4/1979 | Kirkpatrick | 437/31 |
| 4,547,257 | 10/1985 | Iizuka et al. | 156/DIG. 68 |
| 4,997,636 | 3/1991 | Prins | 156/DIG. 68 |
| 5,080,752 | 1/1992 | Kabacoff et al. | 156/DIG. 68 |

*Primary Examiner*—Robert Kunemund
*Assistant Examiner*—FeLisa Garrett
*Attorney, Agent, or Firm*—Kenneth E. Walden; Roger D. Johnson

[57] ABSTRACT

A process for bonding two diamond surfaces together by
(1) forming a layer of opaque nondiamond carbon material between the two diamond surfaces;
(2) pressing the diamond surfaces together with the opaque nondiamond material sandwiched between the diamond surfaces;
(3) used pulse lased light to quickly melt all the opaque nondiamond carbon material before a significant amount of heat is lost through the diamond surface; and then
(4) allowing the resulting carbon melt to cool and solidify as polycrystalline diamond which grows homoepitaxially from the diamond surfaces, bonding those surfaces together.

26 Claims, 1 Drawing Sheet

METHOD OF JOINING DIAMOND STRUCTURES

BACKGROUND OF THE INVENTION

This invention relates to diamond materials and more particular to methods of bonding diamond pieces together.

Diamond is the ideal material for a large number of applications. Diamond is highly transparent to infrared radiation (IR) and radar, has the highest known heat conductivity, highest known hardness, produces little friction, does not conduct electricity, etc. Thus, diamond has properties that make it desirable as structural material for many applications, including radomes.

Unfortunately natural diamond is expensive and does not occur in pieces large enough for many of these applications. Synthetic diamond in generally produced as inexpensive coatings or plates or as small particles. It would be desirable to produce larger pieces such as rods, bars, walls, etc.

Bonding pieces of diamond g material together may be necessary for the construction of large complex structures such as radomes. Organic bonding agents will likely produce weak points in the structure, particularly at elevated temperatures. Inorganic bonding agents may produce mechanical weak point or may interfere with the desirable properties of diamond, such as IR or radar transparency.

SUMMARY OF THE INVENTION

Accordingly an object of this invention is to provide a new method of bonding diamond pieces together.

Another object of this invention is to provide a new method of inexpensively producing larger diamond structural pieces.

A further object of this invention is to provide stronger bonding between diamond pieces.

These and other objects of this invention are achieved by providing a process for bonding two diamond surfaces together in which (1) a layer of opaque nondiamond carbon material is formed between two diamond surfaces which are to be bonded together;

(2) the diamond surfaces are pressed toward each other with the opaque nondiamond material sandwich between the diamond plates;

(3) a laser is used to rapidly melt the opaque nondiamond carbon material; and (4) the resulting carbon/melt is allowed to cool and solidify as polycrystalline diamond which grows homoepitaxially from the diamond surfaces of the pieces to be joined, bonding those surfaces together.

BRIEF DESCRIPTION OF THE DRAWINGS

Still other objects and many of the attendant advantages and features of this invention will be readily appreciated as the same becomes better understood by reference to the following detailed description when considered in connection with the accompanying drawings wherein:

FIGS. 1A, 1B, 1C, 2, 3, and 4 are schematic side views and are not drawn to scale.

DETAILED DESCRIPTION OF THE PREFERRED EMBODIMENT

The present invention provides a method of strongly bonding small diamond objects together to produce larger, more complex diamond objects. The simplest example is the bonding of single crystal or polycrystalline diamond plates together to form bars or rods. Polycrystalline diamond plates are preferred because they are less expensive and less likely to cleave or crack than single crystal diamond plates.

Figure 1A:
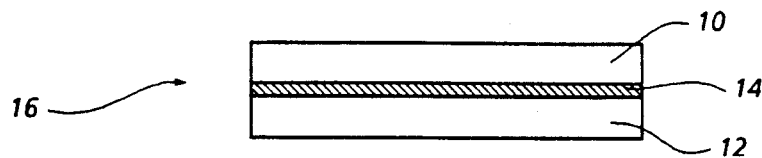
FIG. 1A shows a starting arrangement of a sandwich of two diamond plates with opaque nondiamond material between them.

FIG. 1A is a schematic side view of a sandwich 16 made up of polycrystalline diamond plates 10 and 12 with a layer of nondiamond carbon material 14 between them. (Note that FIGS. 1A, 1B, 1C, 2, 3, and 4 are not drawn to scale.) The nondiamond carbon material 14 may be in a variety of forms including fine powder such as soot (or lampblack). Preferably the nondiamond carbon material will be in the form of a thin, uniform graphite coating on one or both of the diamond plate surfaces to be joined. The graphite coating may be formed by a conventional process such as evaporation, sputtering, etc. Thick coating of graphite will increase the time and cost of the process without increasing the strength of the bonding between plates. Preferably the coating is just thick enough to provide a uniform coating graphite over essentially all the surface area of the plate which will produce a uniform carbon melt coating during the melting step. The diamond plates 10 and 12 are pressed together with the solid nondiamond carbon material 14 in between to form the sandwich structure 16. The pressure must be enough to hold the diamond plates 10 and 12 together during the following melting and cooling steps. However, high pressures which would squeeze the carbon melt 18 (FIG. 1B) from between the diamond plates 10 and 12 are to be avoided.

Figure 1B:
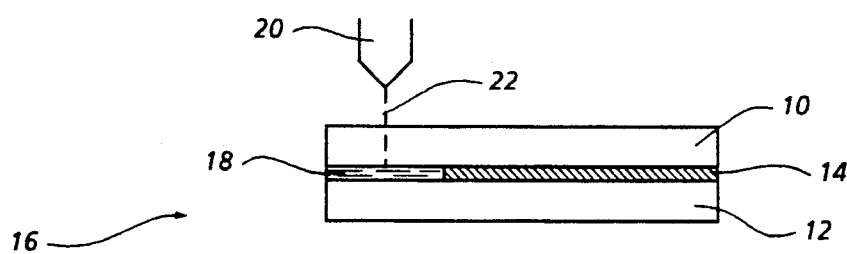
FIG. 1B shows the sandwich during the lased light melting step.

Referring to FIG. 1B, the sandwich structure 16 is irradiated with lased light 22 from a high powered pulse laser 20 to quickly melt the noncarbon material 14 and form areas of carbon melt 18 between the diamond plates 10 and 12. Quickly melting means that the nondiamond carbon material 14 is melted so fast that no significant amount of heat is lost to the diamond plates 10 and 12 before the nondiamond carbon material 14 is completely melted (adiabatic melting). To accomplish this a single short pulse must deliver enough energy to melt all the nondiamond carbon material in the area the laser is focused on. The carbon melt formed will exert great pressures. Therefore to avoid damage to the diamond plates, it is preferable that the lased light 18 is systematically scanned over the nondiamond carbon material 14 producing smaller areas of carbon melt 18 at one time. The area covered by a single pulse of lased light is preferably from about 10 to about 100 and more preferably from 10 to 20 microns in diameter. Melting all the nondiamond carbon material 14 at once might fracture the diamond plates 10 and 12. The lased light scanning is continued until all the nondiamond carbon material 14 has been melted and subsequently converted to polycrystalline diamond.

The laser used in the process of this invention must produce short, high powered pulses of lased light of a wavelength that the diamond plates 10 and 12 are transparent to. The lased light should pass through the diamond plates with little or no absorption. The object is to have essentially all the lased light be absorbed by the opaque nondiamond carbon material 14 to heat and melt this nondiamond carbon material. The preferred wavelength for the lased light is from 1 to 12 microns. High powered pulse lasers such as neodynium YAG (1.060 microns) or $CO_2$ (10 micron) pulse lasers are available to provide a variety of wavelengths. Note if the polycrystalline diamond material heats up when exposed to the lased light, light of a longer wavelength is needed.

The lased light should be in short pulses of high power. Diamond is an excellent conductor or heat and the slow heating of the nondiamond carbon material (e.g., graphite) will result in a large amount of heat being lost before the graphite is melted. However, by using short pulses of preferably from about 1 to about 20 and more preferably from 1 to 5 nanoseconds with high enough power to supply the necessary energy to melt the nondiamond carbon material, the nondiamond carbon material is melted quickly before a significant amount of heat can be lost through the diamond plates (adiabatic process).

The amount of lased light energy per unit area of material will vary with the size, the shape, and the distribution of graphite particles as well as the quantity of graphite material and the thickness of the graphite layer. These variables are numerous, complex, and often interrelated making the calculation or prediction of the amount of energy per unit area very difficult. A better approach is to try different amounts of lased light energy per unit of area of material to be joined. Too little energy is indicated by a failure to melt the graphite and recrystallize it as polycrystalline diamond. too much energy results in damage to the diamond material in the form of voids, charred diamond material, or pieces of material being blown out of the composite. In one approach the laser power and pulse time is set to deliver about 0.5 joules to a circle 100 microns in diameter. If the pulse delivers too much energy and damages the material, the power may be reduce to about 0.1 joules and the test repeated. If the energy is not enough to melt all the graphite, the energy concentration is increased by decreasing the area to which the lased energy is applied by means of a focusing lens. This is gradually done until all the graphite in the area melts and recrystallizes as polycrystalline diamond. If this does not occur by the time the beam of light covers a spot only about 10 microns in diameter, the focus of the lenses is readjusted to once again cover a spot about 100 microns in diameter. The power and/or time of the laser pulse is increased to deliver about the same or slightly more lased light energy per unit area of material as was the case for the narrowest focus (10 microns in diameter). The procedure is repeated until at some energy per unit area value the graphite melts and is recrystallized as polycrystalline diamond. A range of energy per unit area values, rather than a single value, will produce the desired effect of total graphite melt and polycrystalline diamond formation without damage to the material. It would be preferred to determine such a working range of values of lased light energy per unit area of the material and then select a value toward the middle of the range for use in the process.

Figure 1C:
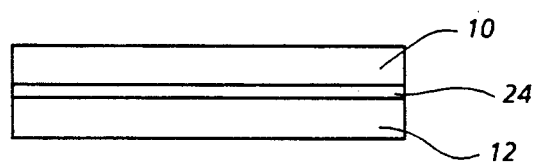
FIG. 1C shows the final product in which the two diamond plates are bound together by polycrystalline diamond.

Immediately after the graphite (or other nondiamond carbon material) has been adiabatically melted in a given area it is allowed to cool and solidify as polycrystalline diamond which grows homoepitaxially from the surfaces of the diamond plates. FIG. 1C is a schematic side view of the product which which comprises diamond plates 10 an 12 which are bonded together by polycrystalline diamond 24.

Figure 2:
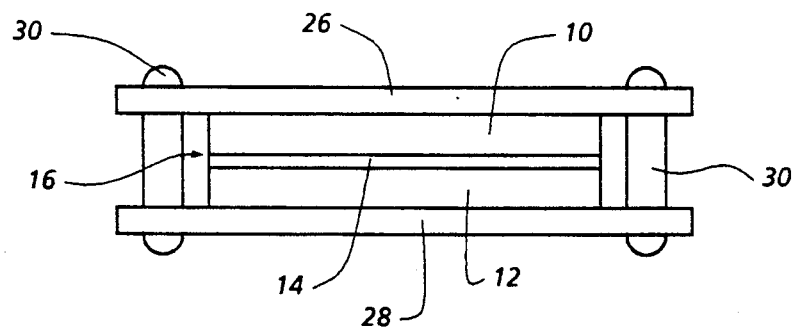
FIG. 2 shows an arrangement for clamping the sandwich between two transparent quartz plates.

FIG. 2 is a schematic side view showing the sandwich structure 16 of FIG. 1A which is placed between two transparent quartz plates 26 and 28 which are compressed together by clamps 30. Such an arrangement allows the pulse lazer to systematically scan the entire area of the diamond plates 10 and 12 and graphite material 14 without interference.

Figure 3:
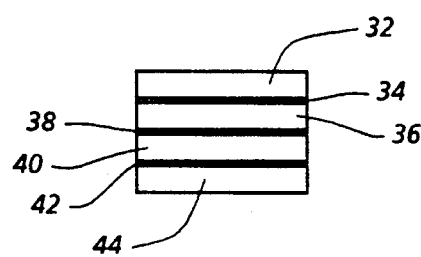
FIG. 3 shows a product of 4 diamond plates bonded together by polycrystalline diamond.
Figure 4:
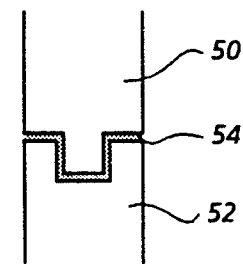
FIG. 4 shows a mortise and tenon joint between two diamond pieces which are bonded together by polycrystalline diamond.

The discussion so far is applied to bonding of two single plates together. However, these basic principles and methods also apply to produce more complex structures. For example, FIG. 3 shows a multilayered structure in which diamond plates 32, 36, 40, and 44 are bonded together by polycrystalline diamond areas 34, 38, and 42. FIG. 4 is a schematic side view of two pieces of diamond 50 and 52 are joined by a mortise and tenon joint in which polycrystalline diamond 54 is formed at 5 pairs of surfaces to bond the diamond pieces 50 and 52 together. In general this process may be used to bind any complex diamond pieces together provided that (1) thin uniform coating of graphite (or other opaque nondiamond carbon material) is formed between all pairs of diamond surfaces to be bonded and (2) the pulsed, lased light can be effectively applied to adiabatically melt all the graphite (or other opaque nondiamond carbon material).

Obviously, numerous modifications and variations of the present invention are possible in light of the foregoing teachings. It is therefore to be understood that within the scope of the appended claims the invention may be practiced otherwise than as specifically described.

What is claimed as new and desired to be secured by Letters Patent of the United States is:

1. A process for bonding two complex diamond structures together, comprising:
   (1) forming a sandwiched structure of a layer of opaque nondiamond carbon material between a surface of one complex diamond structure and a surface of a second complex diamond structure wherein the two complex diamond structures are to be bonded together at the two diamond surfaces and wherein the two diamond surfaces are oriented to each other so that the two complex diamond structures are oriented to each other in a specific desired way;
   (2) using pulsed lased light of a frequency to which the diamond is transparent to quickly melt all the opaque nondiamond carbon material before a significant amount of heat is lost through the diamond surfaces; and then
   (3) allowing the resulting carbon melt to cool and solidify as polycrystalline diamond which grows homoepitaxially from the diamond surfaces, bonding those surfaces and thus the complex diamond pieces together;

wherein in steps (1), (2), and (3) sufficient pressure is applied in a direction which holds the sandwiched structure together but wherein the pressure is not sufficiently high to squeeze molten carbon from between the diamond surfaces.

2. The process of claim 1 wherein the wavelength of the pulsed lased light is from 1 to 12 microns.

3. The process of claim 11 wherein the single crystal diamond surfaces are bonded together.

4. The process of claim 1 wherein one on more of the surfaces to be bonded is made of polycrystalline diamond.

5. The process of claim 1 wherein the opaque, nondiamond carbon material is graphite.

6. The process of claim 5 wherein the graphite is in the form a thin uniform layer covering a diamond surface to be bonded.

7. The process of claim 6 wherein the thin uniform layer of graphite is formed on the diamond surface by vapor deposition.

8. The process of claim 6 wherein thin uniform layer of graphite is formed on the diamond surface by sputtering.

9. The process of claim 1 wherein the lased light in step (3) is systematically scanned over the opaque nondiamond carbon material to limit the amount of carbon melt at any one time.

10. The process of claim 1 wherein the lased light pulses in step (3) are each from about 1 to about 20 nanoseconds long.

11. The process of claim 10 wherein the lased light pulses in step (3) are each from 1 to 5 nanoseconds long.

12. The process of claim 11 wherein each lased light pulse covers an area of from about 10 to about 100 microns in diameter.

13. The process of claim 12 wherein each lased light pulse in step covers an area of from 10 to 20 microns in diameter.

14. A process for bonding two diamond plates together, comprising:
(1) forming a sandwiched structure of a layer of opaque nondiamond carbon material between a surface of one diamond plate and a surface of a second diamond plate wherein the two diamond plates are to be bonded together at the two diamond surfaces and wherein the two diamond surfaces are oriented to each other so that the two diamond plates are oriented to each other in a specific desired way;

(2) using pulsed lased light of a frequency to which the diamond is transparent to quickly melt all the opaque nondiamond carbon material before a significant amount of heat is lost through the diamond surfaces; and then (3) allowing the resulting carbon meld to cool and solidify as polycrystalline diamond which grows homoepitaxially from the diamond surfaces, bonding those surfaces and thus the diamond plates together;

wherein in steps (1), (2), and (3) sufficient pressure is applied in a direction which holds the sandwiched structure together but wherein the pressure is not sufficiently high to squeeze molten carbon from between the diamond surfaces.

15. The process of claim 14 wherein the wavelength of the pulsed lased light is from 1 to 12 microns.

16. The process of claim 14 wherein single crystal diamond surfaces are bonded together.

17. The process of claim 14 wherein one on more of the surfaces to be bonded is made of polycrystalline diamond.

18. The process of claim 14 wherein the opaque, nondiamond carbon material is graphite.

19. The process of claim 18 wherein the graphite is in the form a thin uniform layer covering a diamond surface to be bonded.

20. The process of claim 19 wherein the thin uniform layer of graphite is formed on the diamond surface by vapor deposition.

21. The process of claim 19 wherein the thin uniform layer of graphite is formed on the diamond surface by sputtering.

22. The process of claim 14 wherein the lased light is step (3) is systematically scanned over the opaque nondiamond carbon material to limit the amount of carbon melt at any one time.

23. The process of claim 14 wherein the lased light pulses in step (3) are each from about 1 to about 20 nanoseconds long.

24. The process of claim 23 wherein the lased light pulses in step (3) are each from 1 to 5 nanoseconds long.

25. The process of claim 14 wherein each lased light pulse covers an area of from about 10 to about 100 microns in diameter.

26. The process of claim 25 wherein each lased light pulse in step covers an area of from 10 to 20 microns in diameter.

* * * * *